United States Patent [19]
Brown et al.

[11] Patent Number: 5,329,491
[45] Date of Patent: Jul. 12, 1994

[54] NONVOLATILE MEMORY CARD WITH AUTOMATIC POWER SUPPLY CONFIGURATION

[75] Inventors: David M. Brown, Fair Oaks; David S. Brannam, Cameron Park; Russell D. Eslick, Placerville, all of Calif.

[73] Assignee: Intel Corporation, Santa Clara, Calif.

[21] Appl. No.: 86,178

[22] Filed: Jun. 30, 1993

[51] Int. Cl.$^5$ .................................. G11C 13/00
[52] U.S. Cl. ............................ 365/226; 365/227; 365/228; 365/900
[58] Field of Search ............ 365/226, 227, 228, 900; 307/296.1, 296.6

[56] References Cited

U.S. PATENT DOCUMENTS

| | | | |
|---|---|---|---|
| 4,853,560 | 8/1989 | Iwamura | 307/296.1 |
| 4,912,346 | 3/1990 | Mizuta | 365/228 X |
| 4,916,662 | 4/1990 | Mizuta | 365/228 X |
| 5,008,566 | 4/1991 | Hashimoto | 365/228 X |
| 5,172,342 | 12/1992 | Gochi | 365/226 |
| 5,184,031 | 2/1993 | Hayakawa | 307/296.1 X |
| 5,193,198 | 3/1993 | Yokouchi | 365/226 X |
| 5,197,033 | 3/1993 | Watanabe | 365/226 |
| 5,267,218 | 11/1993 | Elbert | 365/226 |

Primary Examiner—Eugene R. LaRoche
Assistant Examiner—Son Mai

[57] ABSTRACT

A nonvolatile memory card includes a power supply input for receiving a device power supply voltage for the memory card and a plurality of memories arranged in an array. Each of the plurality of memories receives the device power supply voltage from the power supply input. Each of the plurality of memories receives a device power supply voltage indication signal that indicates voltage level of the device power supply voltage and configures circuitry within each of the plurality of memories to operate in accordance with the voltage level of the device power supply voltage. A voltage detection circuit is coupled to the power supply input for detecting the voltage level of the device power supply voltage and for generating the device power supply voltage indication signal. A logic is coupled to the voltage detection circuit and each of the plurality of memories for (1) receiving the device power supply voltage indication signal from the voltage detection circuit, (2) applying the device power supply voltage indication signal to each of the plurality of memories such that the circuitry of each of the plurality of memories is configured in accordance with the device power supply voltage indication signal, and (3) supplying data of the nonvolatile memory card with respect to the voltage level of the device power supply voltage to external circuitry.

12 Claims, 3 Drawing Sheets

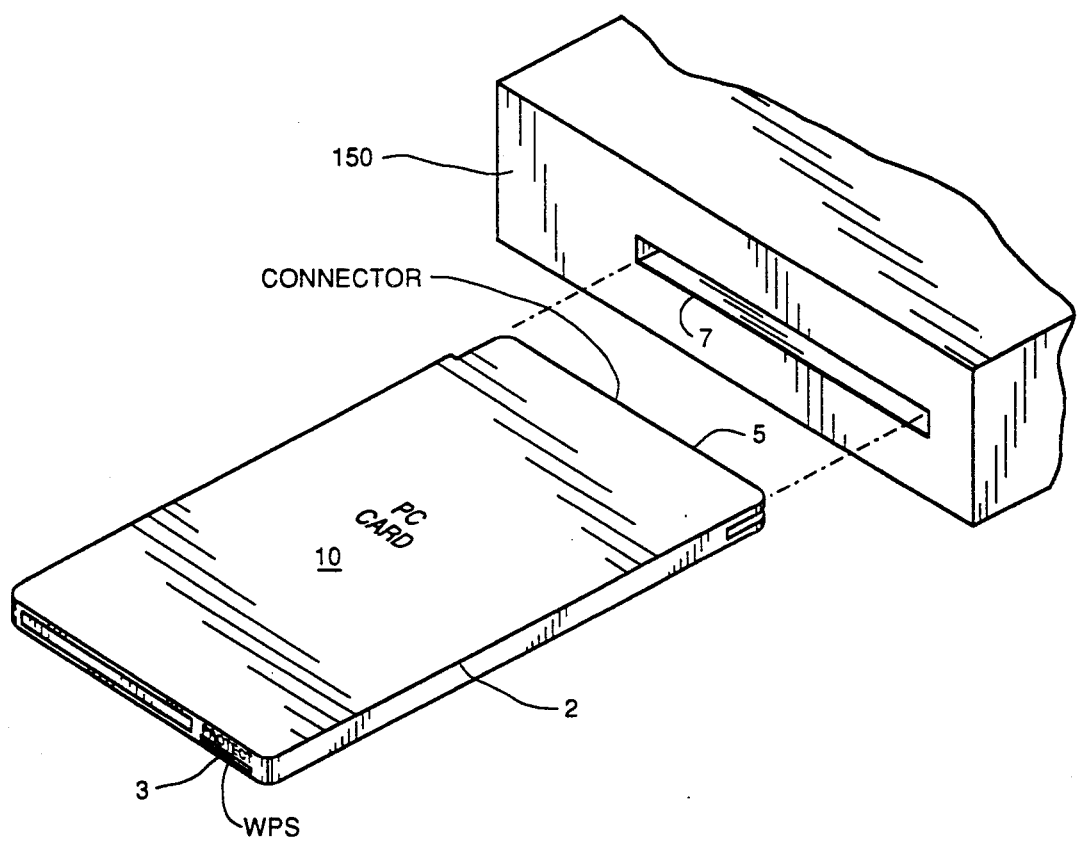
FIG_1

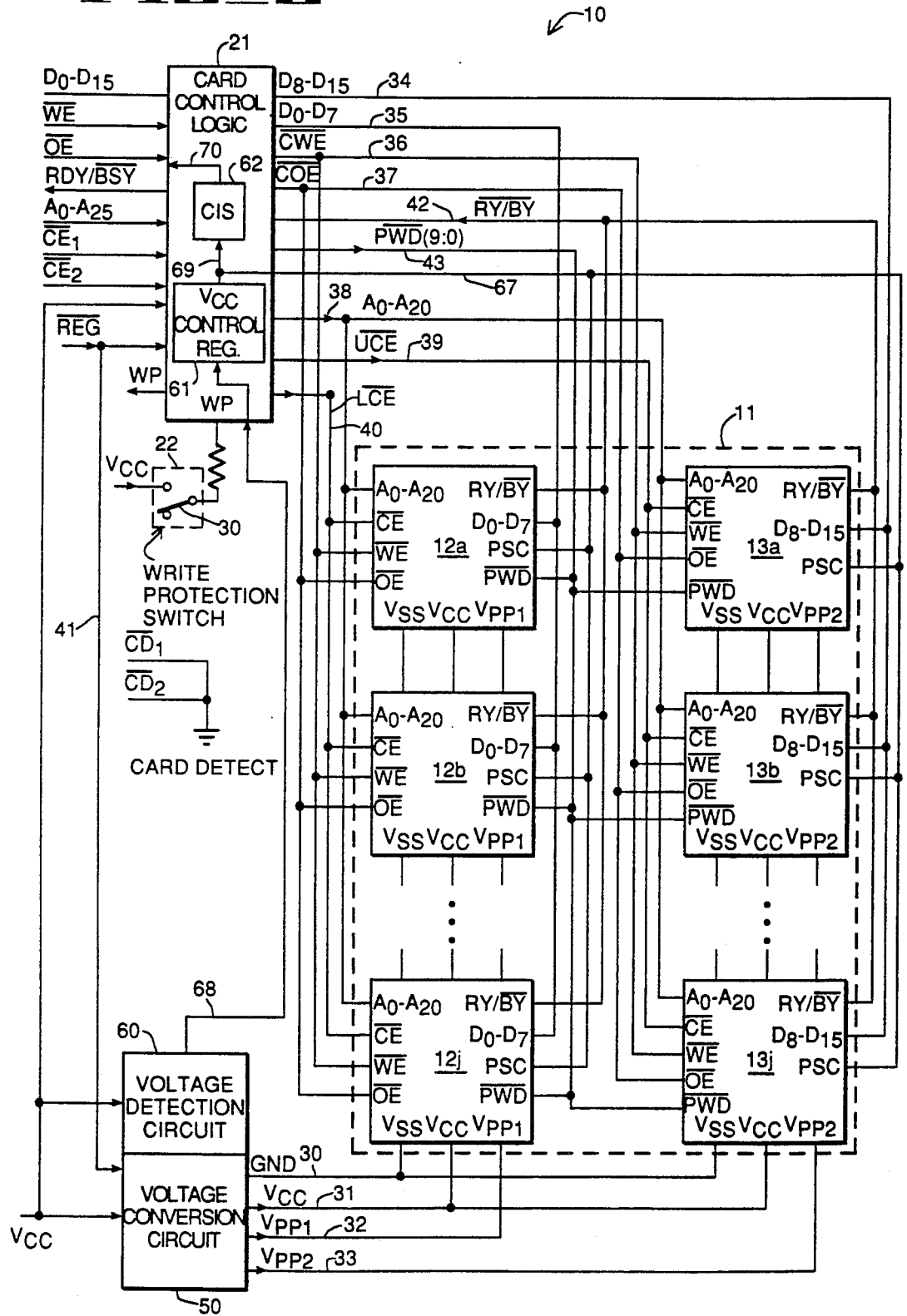

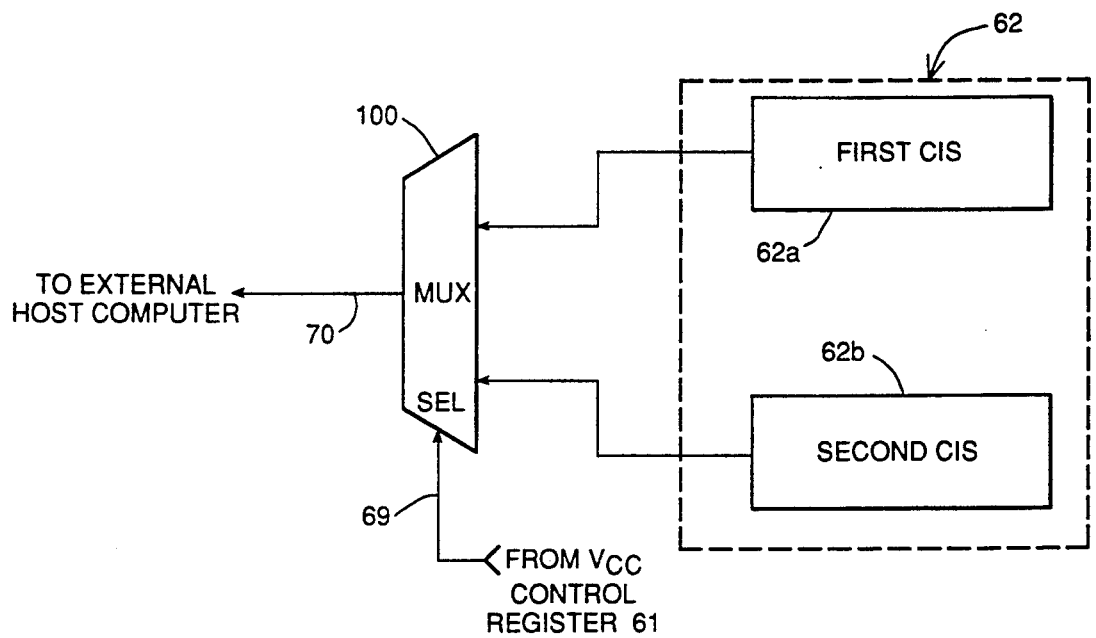
FIG_3

NONVOLATILE MEMORY CARD WITH AUTOMATIC POWER SUPPLY CONFIGURATION

FIELD OF THE INVENTION

The present invention pertains to the field of computer memories. More particularly, this invention relates to an electrically erasable and programmable floating gate nonvolatile memory card with automatic power supply configuration.

BACKGROUND OF THE INVENTION

One type of prior nonvolatile memory is the flash erasable and electrically programmable read-only memory ("flash EPROM"). The flash EPROM can be programmed by a user. Once programmed, the entire contents of the flash EPROM can be erased by electrical erasure. The flash EPROM may then be reprogrammed with new data.

Prior art personal computer systems typically employ removable data storage media. One common prior art removable storage medium is a floppy disk. A relatively new prior art storage medium is an integrated circuit-based memory card ("IC memory card").

Prior art flash EPROMs are nonvolatile and reprogrammable, and this has permitted the flash EPROM technology to be used for removable data storage. One such prior art application is the flash EPROM memory card ("flash memory card"). The flash memory card typically includes a number of flash EPROMs. The flash memory card can be erased and programmed electrically.

One category of prior art personal computer systems typically include desk-top computers and another category of prior art personal computer systems typically include laptop computers. Many prior art desk-top computers typically employ a 5 volt power supply and many prior art laptop computers typically employ a 3 volt power supply.

Like the prior art personal computer systems, one type of prior flash memory card is typically designed to be used in the 3 volt power supply environment ("3 volt flash memory card"). Another type of prior flash memory card is typically designed to be used in the 5 volt power supply environment ("5 volt flash memory card"). The 3 volt flash memory card is typically used in the 3 volt power supply prior art personal computers and the 5 volt flash memory card is typically used in the 5 volt power supply prior art personal computers.

One disadvantage associated with such prior flash memory cards is that a 5 volt flash memory card is typically unsuitable for use in a 3 volt power supply personal computer and a 3 volt flash memory card is typically unsuitable for use in a 5 volt power supply personal computer. Mismatching the power supply of a flash memory card with that of a personal computer typically causes damages to data store in the flash memory card and the flash memory card itself. Therefore, before inserting a flash memory card into a personal computer, the user typically needs to know the power supply of the personal computer and to the power supply for the flash memory card. This typically causes inconvenience to the user. When the user does not know or loses track of the power supply of a particular flash memory card, the user typically cannot use that flash memory card.

Another disadvantage associated with the prior flash memory cards is that the prior flash memory cards typically cannot be automatically self-configured to different power supply voltages. Typically, when the power supply of a 5 volt flash memory card accidentally drops from 5 volts to 3 volts, the 5 volt flash memory card typically cannot function properly and the data stored in that flash memory card may be damaged. Likewise, when the power supply of a 3 volt flash memory card accidentally rises from 3 volts to 5 volts, the 3 volt flash memory card typically cannot function properly and the data stored as well as circuitry of the memory card may also be damaged.

SUMMARY AND OBJECTS OF THE INVENTION

One of the objects of the present invention is to provide a reprogrammable nonvolatile memory card that can be used with different power supply voltages.

Another object of the present invention is to provide a reprogrammable nonvolatile memory card that can automatically configure itself to operate at the power supply voltage to which the memory card is currently connected.

Another object of the present invention is to provide a reprogrammable nonvolatile memory card that is fully interchangeable among different power supply voltages.

A nonvolatile memory card includes a power supply input for receiving a device power supply voltage for the memory card and a plurality of memories arranged in an array. Each of the plurality of memories receives the device power supply voltage from the power supply input. Each of the plurality of memories receives a device power supply voltage indication signal that indicates voltage level of the device power supply voltage and configures circuitry within each of the plurality of memories to operate in accordance with the voltage level of the device power supply voltage. A voltage detection circuit is coupled to the power supply input for detecting the voltage level of the device power supply voltage and for generating the device power supply voltage indication signal. A logic is coupled to the voltage detection circuit and each of the plurality of memories for (1) receiving the device power supply voltage indication signal from the voltage detection circuit, (2) applying the device power supply voltage indication signal to each of the plurality of memories such that the circuitry of each of the plurality of memories is configured in accordance with the device power supply voltage indication signal, and (3) supplying data of the nonvolatile memory card with respect to the voltage level of the device power supply voltage to external circuitry.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 is a perspective view of a flash memory card

FIG. 2 is a block diagram of the flash memory card, which includes a plurality of flash EPROMs, a voltage detection circuit, a power supply $V_{CC}$ control register, and a card information structure (CIS);

FIG. 3 is a block diagram illustrating one embodiment of the card information structure of FIG. 2.

DETAILED DESCRIPTION

FIG. 1 is a perspective view of a flash memory card 10. Inside plastic case 2 of flash memory card 10 there are a plurality of flash EPROMs (not shown in FIG. 1) for storing data at addresses. Flash memory card 10 is inserted to a slot 7 of a personal computer 150 for a memory read or write operation.

Card 10 includes connector 5 located on one side of card 10 to connect card 10 to personal computer 150 when the connector 5 is inserted into slot 7. Card 10 also includes a write protect switch ("WPS") 3.

Computer 150 can be a portable computer, a laptop computer, a desk-top computer, a workstation, a mini computer, a mainframe, or any other type of computer. Computer 150 includes a central processing unit, a memory, and other peripheral devices (all are not shown).

FIG. 2 is a block diagram of flash memory card 10. Flash memory card 10 includes a memory array 11 that includes a plurality of flash EPROMs 12a through 12j and 13a through 13j, each of which includes memory cells that store data at addresses. For one embodiment, memory array 11 includes twenty flash EPROMs.

For other embodiments, memory array 11 may include more or fewer than twenty flash EPROMs. For example, memory array 11 may include two to eighteen flash EPROMs.

For one embodiment, flash memory card 10 can store 40 megabytes ("Mbytes") of data.

For one embodiment, each of flash EPROMs $12a-12j$ and $13a-13j$ can store 16 Mbits (i.e., megabits) of data. For other embodiments, each of flash EPROMs $12a-12j$ and $13a-13j$ of memory array 11 stores more or fewer than 16 Mbits of data.

Each of flash EPROMs $12a-12j$ and $13a-13j$ within memory array 11 includes address inputs $A_0$ through $A_{20}$ and data pins $D_0$ through $D_7$ or $D_8$ through $D_{15}$. Addresses are latched into each of flash EPROMs $12a-12j$ and $13a-13j$ via respective address inputs $A_0$ through $A_{20}$. Each of flash EPROMs $12a-12j$ includes data pins $D_0$ through $D_7$ and each of flash EPROMs $13a-13j$ includes data pins $D_8$ through $D_{15}$.

Each of flash EPROMs $12a-12j$ and $13a-13j$ includes a write enable input pin $\overline{WE}$, an output enable input pin $\overline{OE}$, and a chip enable input pin $\overline{CE}$. The $\overline{WE}$, $\overline{OE}$, and $\overline{CE}$ inputs are each active low. Chip enable $\overline{CE}$ is the chip select for each of flash EPROMs $12a-12j$ and $13a-13j$ and is used for device selection. Output enable $\overline{OE}$ is the output control for each of flash EPROMs $12a-12j$ and $13a-13j$ and is used to gate data from data pins $D_0-D_7$ or $D_8-D_{15}$.

A logical low $\overline{WE}$ input to a particular flash EPROM of flash EPROMs 11 allows that flash EPROM to be written to if the $\overline{CE}$ input for that flash EPROM is logically low. Addresses are latched on the falling edge of a write enable pulse. Data is latched on the rising edge of a write enable pulse.

Each of flash EPROMs $12a-12j$ and $13a-13j$ also includes a program/erase power supply voltage input $V_{PP1}$ or $V_{PP2}$, a device power supply input $V_{CC}$, and a $V_{SS}$ input. $V_{PP1}$ is the program/erase power supply for flash EPROMs $12a-12j$ and $V_{PP2}$ is the program/erase power supply for flash EPROMs $13a-13j$. For one embodiment, flash EPROMs 11 require $V_{PP1}$ and $V_{PP2}$ each to be approximately 12.0 volts. For one embodiment, flash EPROMs 11 require $V_{CC}$ to be approximately 5.0 volts or 3.0 volts. For other embodiments, flash EPROMs 11 allow $V_{CC}$ to be other than 5.0 volts and 3.0 volts. $V_{SS}$ is ground.

Each of flash EPROMs $12a-12j$ and $13a-13j$ is capable of operating at different power supply voltages. For one embodiment, each of flash EPROMs $12a-12j$ and $13a-13j$ can operate at either the 5 volt power supply or the 3 volt power supply. For another embodiment, each of flash EPROMs $12a-12j$ and $13a-13j$ can operate at power supply voltages other than 3 and 5 volts. For alternative embodiments, each of flash EPROMs $12a-12j$ and $13a-13j$ can operate at more power supply voltages than 3 and 5 volts. When notified, each of flash EPROMs $12a-12j$ and $13a-13j$ can configure its circuitry to operate at the applied power supply voltage. For example, when each of flash EPROMs $12a-12j$ and $13a-13j$ is notified that the power supply $V_{CC}$ applied is at 3 volts, each of flash EPROMs $12a-12j$ and $13a-13j$ configures its circuitry to operate at the 3 volt power supply. When each of flash EPROMs $12a-12j$ and $13a-13j$ is notified that the power supply $V_{CC}$ applied is at 5 volts, each of flash EPROMs $12a-12j$ and $13a-13j$ configures its circuitry to operate at the 5 volt power supply.

Each of flash EPROMs $12a-12j$ and $13a-13j$ also includes a power supply voltage indication and configuration input PSC. Power supply voltage indication and configuration PSC is the power supply voltage indication and configuration signal for each of flash EPROMs $12a-12j$ and $13a-13j$. For example, when the power supply voltage indication and configuration PSC signal is at logical high level, it indicates or notifies that the power supply $V_{CC}$ for each of flash EPROMs $12a-12j$ and $13a-13j$ is 3 volts. When notified by the logical high PSC signal, each of flash EPROMs $12a-12j$ and $13a-13j$ configures its circuitry to operate at the 3 volt power supply in accordance with the logical high PSC signal. For example, the read circuit in each of flash EPROMs $12a-12j$ and $13a-13j$ changes its timing circuitry to reflect a slower access at 3 volts, and boosts the read voltage applied at the selected word line to 5 volts during reading. Also, the trip point of the power supply voltage sensing and system lockout circuit within each of flash EPROMs $12a-12j$ and $13a-13j$ is shifted to be below 3 volts in accordance with the logical high PSC signal.

As a further example, when the power supply voltage indication and configuration signal PSC is at logical low level, it signals to each of flash EPROMs $12a-12j$ and $13a-13j$ that the power supply $V_{CC}$ for each of flash EPROMs $12a-12j$ and $13a-13j$ is 5 volts and each of flash EPROMs $12a-12j$ and $13a-13j$ configures its circuitry to operate at the 5 volt power supply. As shown in FIG. 2, each of flash EPROMs $12a-12j$ and $13a-13j$ receives the same PSC signal via line 67.

In absence of a high (i.e., 12 volts) $V_{PP1}$ or $V_{PP2}$ voltage applied to a respective flash EPROM, the flash EPROM acts as a read-only memory. The data stored at an address supplied via the $A_0-A_{20}$ address inputs is read from its memory cell array and made available through its data pins $D_0-D_7$ or $D_8-D_{15}$.

When a 12 volt $V_{PP1}$ or $V_{PP2}$ voltage is supplied to a respective flash EPROM of flash EPROMs 11, the contents of the flash EPROM can be erased by an erasure operation and the device may then be reprogrammed with new data and codes via a program operation. Each of flash EPROMs $12a-12j$ and $13a-13j$ includes circuitry that performs the erasure and programming operations.

Each of flash EPROMs 12a-12j and 13a-13j also includes a power down pin $\overline{PWD}$. Power down pin $\overline{PWD}$ for a flash EPROM is the power down mode control. When the power down $\overline{PWD}$ signal at one of flash EPROMs 12a-12j and 13a-13j is at logical low level, that flash EPROM enters the power down mode.

Each of flash EPROMs 12a-12j and 13a-13j also includes a ready/busy output pin RY/$\overline{BY}$. Ready/busy RY/$\overline{BY}$ is the ready/busy indicator of each of flash EPROMs 12a-12j and 13a-13j. The RY/$\overline{BY}$ output of each of flash EPROMs 12a-12j and 13a-13j is active low. A logically high RY/$\overline{BY}$ output of a flash EPROM indicates a "ready" condition or mode for the flash EPROM (i.e., ready to accept an operation). A logically low RY/$\overline{BY}$ output indicates a "busy" condition or mode for the flash EPROM (i.e., the write state circuitry is presently busy).

Flash memory card 10 further includes card control logic 21. Card control logic 21 interfaces between card pins of flash memory card 10 and flash EPROMs 11. Card control logic 21 includes card information structure ("CIS") 62 and $V_{CC}$ control register 61 which will be described in more detail below. Card control logic 21 also includes address decoder (not show), data control circuit (not shown), and card control registers (not shown).

Card control logic 21 provides control logic for flash memory card 10. Card control logic 21 receives addresses, data, control signals, power and ground. Card control logic 21 in turn (1) oversees reading, erasing, and programming with respect to flash EPROMs 12a-12j and 13a-13j, (2) oversees the use of electrical power within flash memory card 10, (3) oversees the sending out to the host computer (not shown) card information structure data with respect to flash memory card 10, and (4) oversees the sending out to the host computer status information regarding flash memory card 10.

The card information structure data is stored in card information structure 62. The card information structure data contains details describing the structure of flash memory card 10. The details include the name of the manufacturer of flash memory card 10, the type of flash EPROMs 12a-12j and 13a-13j, and the number of flash EPROMs 12a-12j and 13a-13j.

The card information structure data in card information structure 62 further contains information with respect to different power supply voltages for flash memory card 10. The information contains speed, access time, etc. of flash memory card 10 (i.e., flash EPROMs 12a-12j and 13a-13j) with respect to each of the power supply voltages for flash memory card 10. For example, when flash EPROMs 12a-12j and 13a-13j can operate at a 5 volt power supply and a 3 volt power supply, card information structure 62 will have two supersets, each containing information with respect to the speed, access time, etc. of flash memory card 10 (i.e., flash EPROMs 12a-12j and 13a-13j) at one of the two power supply voltages. When flash EPROMs 12a-12j and 13a-13j can operate at more power supply voltages than 3 and 5 volts, card information structure 62 has more than two supersets, each for one of the power supply voltages. Card information structure 62 supplies its data to the external host computer via bus 70.

The card control registers within card control logic 21 are used to control and report status with respect to flash memory card 10. The external host computer can read and write to the card control registers when proper input signal are applied to card control logic 21.

$V_{CC}$ control register 61 is one of the card control registers within card control logic 21. $V_{CC}$ control register 61 is used to indicate the voltage level of the power supply applied to flash memory card 10 and is used to control the configuration of flash EPROMs 12a-12j and 13a-13j and flash memory card 10 as well to operate in accordance with the card power supply voltage received. $V_{CC}$ register 61 outputs the power supply voltage indication and configuration signal to the PSC pin of each of flash EPROMs 12a-12j and 13a-13j via line 67.

For one embodiment, $V_{CC}$ control register 61 is a one bit register. For other embodiments, $V_{CC}$ control register 61 is a multibit register.

$V_{CC}$ control register 61 receives a device power supply voltage indication signal from a voltage detection circuit 60 via line 68. The device power supply voltage indication signal indicates the voltage level of the card power supply received. Voltage detection circuit 60 will be described in more detail below.

For one embodiment, the output of $V_{CC}$ control register 61 is not applied to card information structure 62 and the card information with respect to different power supply voltages of flash memory card 10 will all be read out when card information structure 62 is accessed. For another embodiment, the output of $V_{CC}$ control register 61 is applied to card information structure 62 to allow only the information with respect to the power supply voltage currently applied to flash memory card 10 to be read out.

Flash memory card 10 includes address input pins $A_0$ through $A_{25}$ and data pins $D_0$ through $D_{15}$. Both address pins $A_0$-$A_{25}$ and data pins $D_0$-$D_{15}$ are coupled to card control logic 21. Addresses applied to pins $A_0$-$A_{25}$ are latched in card control logic 21. Data pins $D_0$-$D_{15}$ are employed to input data during memory write cycles, and to output data during memory read cycles. Data pins $D_0$-$D_{15}$ are active high and float to tri-state OFF when card 10 is deselected or the outputs are disabled.

Flash memory card 10 receives card enable inputs $\overline{CE}_1$ and $\overline{CE}_2$ and output enable input $\overline{OE}$. Card enables $\overline{CE}_1$ and $\overline{CE}_2$ are chip selects that are used for selecting flash EPROMs 12a-12j and 13a-13j. Card control logic 21 outputs a $\overline{LCE}$ signal and a $\overline{UCE}$ signal based on the $\overline{CE}_1$ and $\overline{CE}_2$ signals received. Output enable $\overline{OE}$ is the output control of the card and is used to gate data from $D_0$-$D_{15}$ pins independent of accessed flash EPROM selection. The $\overline{OE}$ signal is processed by card control logic 21 to become a $\overline{COE}$ signal which is coupled to the $\overline{OE}$ pin of each of flash EPROM 12a-12j and 13a-13j via line 37. When the $\overline{COE}$ is at logical high level, the outputs from all flash EPROMs 12a-12j and 13a-13j are disabled. Data pins $D_0$-$D_{15}$ of the card are placed in a high impedance state.

Card enable $\overline{CE}_1$ is used to enable flash EPROMs 12a-12j. Card enable $\overline{CE}_2$ is used to enable flash EPROMs 13a-13j. When both $\overline{CE}_1$ and $\overline{CE}_2$ are at a logical high level, the card is deselected and the power consumption is reduced to standby level.

Flash memory card 10 also includes a card write enable pin $\overline{WE}$. The card write enable $\overline{WE}$ controls writes to card control logic 21 and flash EPROMs 12a-12j and 13a-13j. When the card $\overline{WE}$ is at logical high level, data input to flash memory card 10 is disabled. The $\overline{WE}$ signal is processed by card control logic 21 to become a $\overline{CWE}$ signal which is coupled to the $\overline{WE}$ input of each of flash EPROMs 12a-12j and 13a-13j via line 36.

The address decoder of card control logic 21 provides the necessary logic to decode the individual chip enable $\overline{CE}$ signals needed internally to card 10 to select among flash EPROMs 12a-12j and 13a-13j. Chip enable signal $\overline{CE}$ for flash EPROMs 12a-12j is provided via $\overline{LCE}$ signal line 40. Chip enable signal $\overline{CE}$ for flash EPROMs 13a-13j is supplied via $\overline{UCE}$ signal line 39. Memory address decoding is linearly mapped in card 10. The memory address is then applied to the selected one of flash EPROMs 12a-12j and 13a-13j via $A_0$–$A_{20}$ address bus 38.

Flash memory card 10 also includes a card ready/busy output pin RY/$\overline{BSY}$. The card ready/busy RY/$\overline{BSY}$ output indicates whether the card is busy or ready. Card control logic 21 receives the RY/$\overline{BY}$ output from each of flash EPROMS 12a-12j and 13a-13j via line 42 and then outputs the card ready/busy output RY/$\overline{BSY}$ to external circuitry.

Flash memory card 10 includes an active low register memory select input pin $\overline{REG}$. The $\overline{REG}$ signal, when logically low, allows card control logic 21 to output the card information structure data from card information structure 62 to the external host computer. In addition, when the $\overline{REG}$ signal is logically low, the card information structure data stored in card information structure 62 can be updated by a write operation to card control logic 21. Moreover, the logical low $\overline{REG}$ signal also allows access to the card control registers of card control logic 21. In other words, the $\overline{REG}$ pin controls the operation to either flash EPROMs 12a-12j and 13a-13j or card control logic 21.

Flash memory card 10 includes two card detection pins $\overline{CD}_1$ and $\overline{CD}_2$. The card detection pins $\overline{CD}_1$ and $\overline{CD}_2$ allow the host computer system to determine if card 10 is properly loaded.

Flash memory card 10 includes a write protection switch 22. Switch 22 disables circuitry (not shown) in card control logic 21 that controls the write enable signal $\overline{WE}$ to flash EPROMs 12a-12j and 13a-13j. When switch 22 is activated (i.e., a switch knife 30 is connected to the $V_{CC}$), the $\overline{WE}$ output of card control logic 21 is forced high, thus preventing any writes to each of flash EPROMs 12a-12j and 13a-13j.

Flash memory card 10 also includes a write protection output pin WP. When the WP pin is at active high voltage all write operations to the card are disabled. The WP pin reflects the condition of write protection switch 22.

$V_{CC}$ is the card power supply for flash memory card 10 and GND is ground for the card. For one embodiment, card power supply $V_{CC}$ of flash memory card 10 is allowed to be either 3 volts or 5 volts. In this situation, flash memory card 10 will configure each of flash EPROMs 12a-12j and 13a-13j to operate under either the 3 volt power supply or the 5 volt power supply. For other embodiments, card power supply $V_{CC}$ of flash memory card 10 is allowed to be more than 3 and 5 volts or different from 3 and 5 volts.

The device power supply $V_{CC}$ is coupled to a voltage conversion circuit 50. Voltage conversion circuit 50 also receives the $\overline{REG}$ signal via line 41. Voltage conversion circuit 50 applies the $V_{CC}$ voltage to each of flash EPROMs 12a-12j and 13a-13j. Voltage conversion circuit 50 generates and applies the program/erase voltage $V_{PP}$ to each of flash EPROMs 12a-12j and 13a-13j.

In another embodiment, flash memory card 10 does not include voltage conversion circuit 50. When this occurs, the external host computer needs to supply the device power supply voltage $V_{CC}$ and the program/erase voltage $V_{PP}$, respectively, to flash memory card 10.

Flash memory card 10 includes a function of automatically configuring itself to the card power supply voltage $V_{CC}$ it currently receives. For example, when the card power supply voltage $V_{CC}$ applied to flash memory card 10 is approximately 3 volts, flash memory card 10 configures itself to be a 3 volt flash memory card. When the card power supply voltage $V_{CC}$ applied to flash memory card 10 is approximately 5 volts, flash memory card 10 confirms itself to be a 5 volt flash memory card. This function of flash memory card 10 is achieved by power supply configurable flash EPROMs 12a-12j and 13a-13j, $V_{CC}$ control register 61, and voltage detection circuit 60. The function will be described in more detail below.

In addition, card information structure 62 stores parameters of flash memory card 10 with respect to different power supply voltages. When accessed, card information structure 62 supplies those parameters to the external host computer such that the external host computer knows that flash memory card 10 is a power supply configurable flash memory card. Moreover, the external host computer also learns the power supply voltages under which flash memory card 10 can be configured to operate.

As described above, flash memory card 10 includes voltage detection circuit 60. Voltage detection circuit 60 receives the card power supply voltage $V_{CC}$. Voltage detection circuit 60 detects the voltage level of the card power supply voltage $V_{CC}$ and generates the device power supply voltage indication signal to $V_{CC}$ control register 61 via line 68. Voltage detection circuit 60 generates the device power supply voltage indication signal based on the voltage level applied at the power supply $V_{CC}$ pin of flash memory card 10. For example, when the card power supply voltage $V_{CC}$ is at approximately 3 volts, voltage detection circuit 60 generates a logical high signal to $V_{CC}$ control register 61 via line 68. When the card power supply voltage $V_{CC}$ is at approximately 5 volts, voltage detection circuit 60 generates a logical low signal to $V_{CC}$ control register 61 via line 68.

For one embodiment, voltage detection circuit 60 is a SEIKO voltage sensing circuit (Part No. S-80740SL-A4-TX) manufactured by SEIKO Instruments, Inc. of Japan. For alternative embodiments, voltage detection circuit 60 can be other known voltage sensing circuits.

$V_{CC}$ control register 61 then receives the device power supply voltage indication signal via line 68 and stores the signal. $V_{CC}$ control register 61 then outputs the device power supply voltage indication and configuration signal to the PSC pin of each of flash EPROMs 12a-12j and 13a-13j to configure each of flash EPROMs 12a-12j and 13a-13j to operate at the card power supply voltage applied at the $V_{CC}$ pin of flash memory card 10. $V_{CC}$ control register 61 outputs the device power supply voltage indication and configuration signal in accordance with the device power supply voltage indication signal received from voltage detection circuit 60. For example, when the device power supply voltage indication signal indicates that the card power supply $V_{CC}$ is approximately 5 volts, $V_{CC}$ control register 61 outputs a 5 volt device power supply voltage indication and configuration signal accordingly to notify each of flash EPROMs 12a-12j and 13a-13j that the device power supply $V_{CC}$ is at 5 volts and to cause each of flash EPROMs 12a-12j and 13a-13j to be configured to operate at the 5 volt power supply. When the device power supply voltage indication signal indicates that the card power supply voltage $V_{CC}$ is approximately 3 volts, $V_{CC}$ control register 61 generates a 3 volt device power supply voltage indication and configuration signal accordingly to notify each of flash EPROMs 12a-12j and 13a-13j that the device power supply $V_{CC}$ is at 3 volts and to cause each of flash EPROMs 12a-12j and 13a-13j to be configured to operate at the 3 volt power supply. Therefore, flash memory card 10 obtains the automatic power supply configuration function and can be used in different power supply systems.

As described above, card information structure 62 stores parameters of flash memory card 10 with respect to different power supply voltages. When accessed, card information structure 62 supplies these parameters. As is also described above, there are two embodiments of reading these parameters. For one embodiment, the parameters with respect to all different power supply voltages are read out of card information structure 62 when accessed such that the external host computer knows that flash memory card 10 has the power supply configuration function and the supply voltage configuration range of flash memory card 10. The external host computer then has the option to select the power supply voltage for flash memory card 10 and the entire system. For this embodiment, the output of $V_{CC}$ control register 61 is not applied to card information structure 62.

For another embodiment, the device power supply voltage indication and configuration signal from $V_{CC}$ control register 61 is applied to card information structure 62 to selectively cause the parameters with respect to the particular device power supply $V_{CC}$ currently applied at the $V_{CC}$ pin of flash memory card 10 to be read out. FIG. 3 illustrates this embodiment, which will be described in more detail below.

As shown in FIG. 3, card information structure 62 includes a first card information structure 62a and a second card information structure 62b, each storing a set of parameters of flash memory card 10 with respect to one of two device power supply voltages. A multiplexer 100 is provided to selectively couple data in one of first and second card information structures 62a-62b to the external host computer under the control of the device power supply voltage indication and configuration signal from $V_{CC}$ control register 61 (FIG. 2). In this case, the external host computer, however, does not know that flash memory card 10 has the automatic power supply configuration function.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory card, comprising:
   (A) a power supply input for receiving a device power supply voltage for the memory card;
   (B) a plurality of memories arranged in an array, wherein each of the plurality of memories receives the device power supply voltage from the power supply input, wherein each of the plurality of memories receives a device power supply voltage indication signal that indicates voltage level of the device power supply voltage and configures circuitry within each of the plurality of memories to operate in accordance with the voltage level of the device power supply voltage;
   (C) a voltage detection circuit coupled to the power supply input for detecting the voltage level of the device power supply voltage and for generating the device power supply voltage indication signal;
   (D) a logic coupled to the voltage detection circuit and each of the plurality of memories for (1) receiving the device power supply voltage indication signal from the voltage detection circuit, (2) applying the device power supply voltage indication signal to each of the plurality of memories such that the circuitry of each of the plurality of memories is configured in accordance with the device power supply voltage indication signal, and (3) supplying data of the nonvolatile memory card with respect to the voltage level of the device power supply voltage to external circuitry.

2. The memory card of claim 1, wherein the voltage level of the device power supply voltage can be at a first voltage and a second voltage, wherein the device power supply voltage indication signal includes a first and a second device power supply voltage indication signal, wherein the voltage detection circuit generates the first device power supply voltage indication signal when the device power supply voltage is at the first voltage, wherein the voltage detection circuit generates the second device power supply voltage indication signal when the device power supply voltage is at the second voltage.

3. The memory card of claim 2, wherein the first voltage is approximately 3 volts and the second voltage is approximately 5 volts.

4. The memory card of claim 2, wherein the logic supplies first data of the nonvolatile memory card with respect to the first voltage when the voltage detection circuit generates the first device power supply voltage indication signal, wherein the logic supplies second data of the nonvolatile memory card with respect to the second voltage when the voltage detection circuit generates the second device power supply voltage indication signal.

5. The memory card of claim 4, wherein the logic further comprises
   (i) a register for storing the device power supply voltage indication signal from the voltage detection circuit and for supplying the device power supply voltage indication signal to each of the plurality of memories; and
   (ii) a multiplexer coupled to receive the first and second data and the device power supply voltage indication signal from the register for selectively coupling one of the first and second data to the external circuitry under control of the device power supply voltage indication signal, wherein the multiplexer couples the first data to the external circuitry when the multiplexer receives the first device power supply voltage indication signal, wherein the multiplexer couples the second data to the external circuitry when the multiplexer receives the second device power supply voltage indication signal.

6. The memory card of claim 1, wherein each of the plurality memories includes memory cells that are electrically programmable and electrically erasable.

7. A nonvolatile memory card, comprising:
   (A) a power supply input for receiving a device power supply voltage for the memory card;
   (B) a plurality of memories arranged in an array, wherein each of the plurality of memories receives the device power supply voltage from the power supply input, wherein each of the plurality of memories receives a device power supply voltage indication signal that indicates voltage level of the device power supply voltage and configures circuitry within each of the plurality of memories to operate in accordance with the voltage level of the device power supply voltage, wherein the voltage level of the device power supply voltage can be at a first voltage and a second voltage, wherein the device power supply voltage indication signal includes a first and a second device power supply voltage indication signal;
   (C) a voltage detection circuit coupled to the power supply input for detecting the voltage level of the device power supply voltage and for generating the device power supply voltage indication signal, wherein the voltage detection circuit generates the first device power supply voltage indication signal when the device power supply voltage is at the first voltage, wherein the voltage detection circuit generates the second device power supply voltage indication signal when the device power supply voltage is at the second voltage;
   (D) a logic coupled to the voltage detection circuit and each of the plurality of memories for (1) receiving the device power supply voltage indication signal from the voltage detection circuit, (2) applying the device power supply voltage indication signal to each of the plurality of memories such that the circuitry of each of the plurality of memories is configured in accordance with the device power supply voltage indication signal, and (3) supplying data of the nonvolatile memory card with respect to the voltage level of the device power supply voltage to external circuitry, wherein the logic supplies first data of the nonvolatile memory card with respect to the first voltage and second data of the nonvolatile memory card with respect to the second voltage when the voltage detection circuit generates the first and second device power supply voltage indication signals.

8. The memory card of claim 7, wherein the first voltage is approximately 3 volts and the second voltage is approximately 5 volts.

9. The memory card of claim 7, wherein each of the plurality memories includes memory cells that are electrically programmable and electrically erasable.

10. The memory card of claim 7, wherein the logic supplies the first data when the voltage detection circuit generates the first device power supply voltage indication signal, wherein the logic supplies the second data when the voltage detection circuit generates the second device power supply voltage indication signal.

11. The memory card of claim 10, wherein the logic further comprises
    (i) a register for storing the device power supply voltage indication signal from the voltage detection circuit and for supplying the device power supply voltage indication signal to each of the plurality of memories; and
    (ii) a multiplexer coupled to receive the first and second data and the device power supply voltage indication signal from the register for selectively coupling one of the first and second data to the external circuitry under control of the device power supply voltage indication signal, wherein the multiplexer couples the first data to the external circuitry when the multiplexer receives the first device power supply voltage indication signal, wherein the multiplexer couples the second data to the external circuitry when the multiplexer receives the second device power supply voltage indication signal.

12. The memory card of claim 11, wherein the first and second data are stored in a card information structure.

* * * * *